United States Patent
Yedur et al.

(10) Patent No.: US 6,884,999 B1
(45) Date of Patent: Apr. 26, 2005

(54) USE OF SCANNING PROBE MICROSCOPE FOR DEFECT DETECTION AND REPAIR

(75) Inventors: Sanjay K. Yedur, San Ramon, CA (US); Bhanwar Singh, Morgan Hill, CA (US); Bryan K. Choo, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 411 days.

(21) Appl. No.: 09/729,513

(22) Filed: Dec. 4, 2000

Related U.S. Application Data

(60) Provisional application No. 60/242,834, filed on Oct. 24, 2000.

(51) Int. Cl.[7] .............................. G21K 7/00; G11B 9/00; G11C 13/00
(52) U.S. Cl. ....................... 250/306; 250/307; 369/126; 365/118
(58) Field of Search ................................ 250/306, 307, 250/310, 311, 492.2, 492.3; 369/126; 365/118; 73/12.09, 105

(56) References Cited

U.S. PATENT DOCUMENTS

| | | | | |
|---|---|---|---|---|
| 4,747,698 A | * | 5/1988 | Wickramasinghe et al. ..... | 374/6 |
| 4,896,044 A | * | 1/1990 | Li et al. ................... | 250/492.3 |
| 5,356,218 A | * | 10/1994 | Hopson et al. ............. | 374/124 |
| 5,546,374 A | * | 8/1996 | Kuroda et al. ............. | 369/126 |
| 5,618,760 A | | 4/1997 | Soh et al. | |
| 5,627,815 A | * | 5/1997 | Koyanagi et al. ........... | 369/126 |
| 5,666,190 A | * | 9/1997 | Quate et al. ................. | 355/71 |
| 5,702,849 A | * | 12/1997 | Sakata et al. ................... | 430/5 |
| 5,865,978 A | * | 2/1999 | Cohen ......................... | 205/118 |
| 5,866,807 A | * | 2/1999 | Elings et al. ................. | 73/105 |
| 5,966,677 A | | 10/1999 | Fiekowsky | |
| 6,000,947 A | | 12/1999 | Minne et al. | |
| 6,181,097 B1 | * | 1/2001 | Li et al. ..................... | 318/592 |
| 6,197,455 B1 | * | 3/2001 | Yedur et al. .................. | 430/5 |
| 6,232,597 B1 | * | 5/2001 | Kley .......................... | 250/234 |
| 6,366,340 B1 | * | 4/2002 | Ishibashi et al. ............. | 355/69 |
| 2002/0104963 A1 | * | 8/2002 | Mancevski .................. | 250/306 |

OTHER PUBLICATIONS

Mango, R. and Bennett, B.R.; "Nanostructure Patterns Written in III–V Semiconductors by an Atomic Force Microscope", Applied Physics; Apr. 7, 1997, American Institute of Physics, vol. 70, No. 14, pp. 1855–1857.

Sugimura, H., et al., "Maskless Patterning of Silicon Surface Based on Scanning Tunneling Microscope Tip–Induced Anodization and Chemical Etching", Applied Physics; Sep. 19, 1994, American Institute of Physics, vol. 65, No. 12, pp. 1569–1571.

* cited by examiner

Primary Examiner—John R. Lee
Assistant Examiner—Kalimah Fernandez
(74) Attorney, Agent, or Firm—Amin & Turocy, LLP

(57) ABSTRACT

The present invention provides a system and method for detecting and repairing defects in semiconductor devices. According to the invention, defects are located using a scanning probe microscope, such as an atomic force microscope or a scanning tunneling microscope, and repaired at locations determined by the scanning probe microscope. The microscope itself, and in particular the detection tip, may be employed to remove the defects. For example, the tip may be used to machine away the defect, to apply an electric field to oxidize the defect, and/or to heat the defect causing it to burn or vaporize. By combining precise defect location capabilities of a scanning probe microscope with defect removal, the invention permits very precise correction of defects such as excess material and foreign particles on semiconductor substrates.

21 Claims, 5 Drawing Sheets

USE OF SCANNING PROBE MICROSCOPE FOR DEFECT DETECTION AND REPAIR

CROSS REFERENCE TO RELATED APPLICATIONS

This application claims the benefit of U.S. Provisional Patent Application Ser. No. 60/242,834, filed Oct. 24, 2000, entitled USED OF SCANNING PROBE MICROSCOPE FOR DEFECT DETECTION AND REPAIR.

TECHNICAL FIELD

The present invention generally relates to semiconductor processing, and in particular to a method of detecting and repairing defects in a semiconductor or other type of workpiece.

BACKGROUND OF THE INVENTION

In the semiconductor industry, there is a continuing trend toward higher device densities. To achieve these high densities there have been, and continue to be, efforts toward scaling down the device dimensions on semiconductor wafers. In order to accomplish higher device density, smaller and smaller features sizes are required. These may include the width and spacing of interconnecting lines, spacing and diameter of contact holes, and surface geometry of corners and edges of various features.

High resolution lithographic processes are used to achieve small features. In general, lithography refers to processes for pattern transfer between various media. In lithography for integrated circuit fabrication, a silicon slice, the wafer, is coated uniformly with a radiation-sensitive film, the resist. The film is selectively exposed with radiation (such as optical light, x-rays, or an electron beam) through an intervening master template, the mask, forming a particular pattern. Exposed areas of the coating become either more or less soluble than the unexposed areas (depending on the type of coating) in a particular solvent developer. The more soluble areas are removed with the developer in a developing step. The less soluble areas remain on the silicon wafer forming a patterned coating. The pattern corresponds to the image of the mask or its negative. The patterned resist is used in further processing of the silicon wafer. Defects in the mask or the patterned resist may result in defects in the processed wafer.

In spite of advances in lithographic procedures, processed silicon wafers sometimes have defects, such as excess material or particulate contaminants. To improve quality, tools have been developed to detect such defects. One such tool, a scanning probe microscope, will detect many of the types of defects that can occur in processed silicon wafers.

Scanning probe microscopes come in several forms. One form is an Atomic Force Microscope (AFM), which is sometimes alternatively referred to as a Scanning Force Microscope (SFM). AFMs include a sensor with a spring-like cantilever rigidly mounted at one end and having a scanning tip at a free end. AFMs may operate in contacting and non-contacting modes. In the contacting mode, the tip of an AFM is placed in low force contact with a surface of a semiconductor wafer or other workpiece of interest. The workpiece is then displaced relative to the AFM in one or more directions in a plane (e.g., the tip contacts the workpiece in a Z axis while the workpiece is displaced in the X and/or Y directions), to effect a scanning of the workpiece surface. As surface contours or other topographic features are encountered by the tip during scanning, the cantilever deflects. The cantilever deflection is then measured, whereby the topography of the workpiece may be determined.

In non-contacting operation, the tip is held a short distance, typically 5 to 500 Angstroms, from the workpiece surface, and is deflected during scanning by various forces between the workpiece and the tip. Such forces may include magnetic, electrostatic, and van der Waals forces. In both the contacting and non-contacting modes, measurements of a workpiece topography or other characteristic features are obtained through measuring the deflection of the cantilever. Deflection of the cantilever may be measured using precisely aligned optical components coupled to deflection measurement circuitry, although other techniques are sometimes employed.

Another form of scanning probe microscope is a Scanning Tunneling Microscope (STM). Where a feature of interest is non-topographic, AFMs as well as STMs may be used to measure the workpiece feature. Examples of non-topographic features include the detection of variations in conductivity of a semiconductor workpiece material. An AFM can be used to scan a workpiece in the non-contacting mode during which deflections in the cantilever are caused by variations in the workpiece conductivity or other property of interest. The deflections can be measured to provide a measurement of the feature. STMs include a conductive scanning tip which is held in close proximity (within approximately 5 Angstroms) to the workpiece. At this distance, the probability density function of electrons on the tip spatially overlap the probability density function of atoms on the workpiece. Consequently, a tunneling current flows between the workpiece surface and the tip if a suitable bias voltage is applied between the tip and the workpiece. The workpiece and tip are relatively displaced horizontally (in the X and/or Y directions) while the tip is held a constant vertical distance from the workpiece surface. The variations in the current can be measured to determine the changes in the workpiece surface.

In another mode of operation, an STM can be used to measure topography. The scanner moves the tip up and down while scanning in the X and/or Y directions and sensing the tunneling current. The STM attempts to maintain the distance between the tip and the surface constant (through moving the tip vertically in response to measured current fluctuations). The movements of the tip up and down can be correlated to the surface topography profile of a workpiece.

While there has been significant progress in detecting defects, less progress has been made in repairing defects. Parts with defects may be discarded, but it would be advantageous if they could be reliably repaired. With the scaled down geometries of today's semiconductor devices, large wafers can have values, when fully processed, exceeding six figures. There is an unsatisfied need for a system and method of repairing defects in semiconductor devices with small features.

SUMMARY OF THE INVENTION

The present invention provides a system and method for detecting and repairing defects in semiconductor devices. According to the invention, defects are located using a scanning probe microscope, such as an atomic force microscope or a scanning tunneling microscope, and repaired at locations determined by the scanning probe microscope. The microscope itself, and in particular the detection tip, may be employed to remove the defects. For example, the tip may be used to machine away the defect, to apply an electric field to oxidize the defect, and/or to heat the defect causing it to burn or vaporize. By combining precise defect location capabilities of a scanning probe microscope with defect removal, the invention permits very precise correction of defects such as excess material and foreign particles on semiconductor substrates.

One aspect of the invention provides a system for repairing defects in a semiconductor substrate including a scanning probe microscope having a detection tip and a defect repair system, wherein the defect repair system repairs defects in a substrate at location determined by the scanning probe microscope.

Another aspect of the invention provides a system for repairing defects in a semiconductor substrate including a scanning probe microscope and means for selectively processing the semiconductor substrate to repair defects at locations on the semiconductor substrate determined by the scanning probe microscope.

A further aspect of the invention provides a method of repairing a defect in a semiconductor substrate including the steps of locating the defect using a scanning probe microscope and repairing the defect using the location determined by the scanning probe microscope.

The invention extends to features hereinafter fully described and features particularly pointed out in the claims. The following detailed description and the annexed drawings set forth in detail certain illustrative examples of the invention. These examples are indicative of but a few of the various ways in which the principles of the invention may be employed. Other ways in which the principles of the invention may be employed and other objects, advantages and novel features of the invention will be apparent from the detailed description of the invention when consider in conjunction with the drawings.

DETAILED DESCRIPTION OF THE INVENTION

Figure 1:
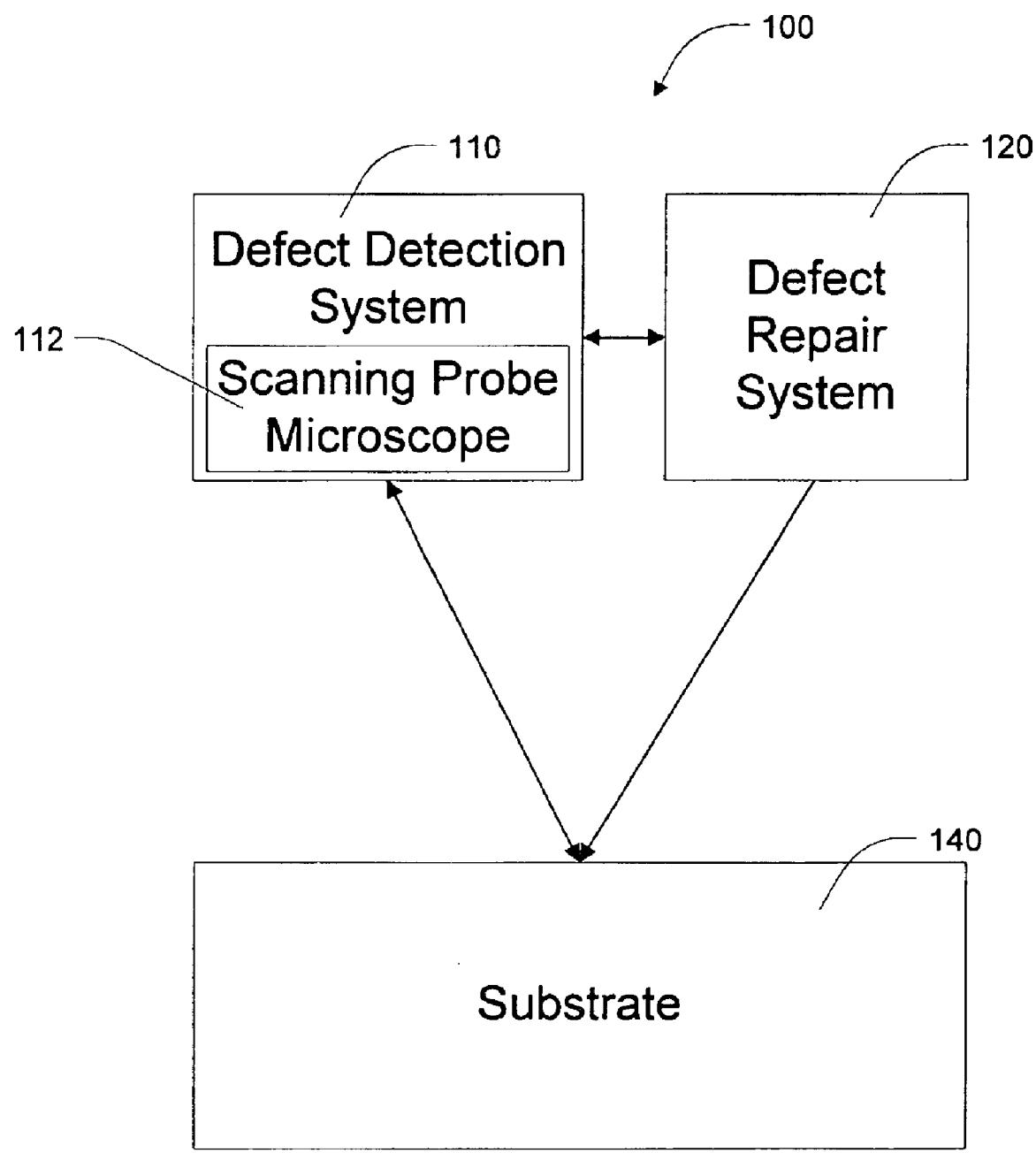
FIG. 1 is a high level schematic of a system according to one aspect of the present invention.

FIG. 1 is a high level schematic of a system 100 according to one aspect of the present invention. System 100 includes defect detection system 110 and defect repair system 120, which may be combined in one apparatus. Defect detection system 10 includes scanning probe microscope 112. Defect repair system 120 repairs defects in substrate 140 at locations determined by defect detection system 10. Defect detection system 10 may transfer a defect map to defect repair system 120 or, where the systems are combined, may repair defects using scanning probe microscope 112. By combining defect repair with a scanning probe microscope's sensitive defect location ability, system 100 is able to carry out very precise repairs.

While the invention can be applied to any type of substrate, it is applied in particular to semiconductor substrates. A semiconductor substrate includes a semiconducting material, such as silicon. In addition to a semiconducting material, the substrate may include various elements and/or layers; including metal layers, barrier layers, dielectric layers, device structures, active elements and passive elements including silicon gates, word lines, source regions, drain regions, bit lines, bases emitters, collectors, conductive lines, conductive plugs, etc. The substrate may have defects such as excess material or particulate contaminates.

The scanning probe microscope may be of any kind suitable for detecting defects in the substrate. For example, the microscope may be an atomic force microscope, a scanning tunneling microscope, or a scanning near-field optical microscope. The microscope may make measurements based on any suitable short range interaction with the substrate surface, including forces such as Van der Waals, electrostatic, and magnetic, tunneling electrons, or evanescent photons. The microscope may be operated in contact mode, non-contact mode, or tapping mode. The scanning probe microscope may obtain topographical information, compositional information, material state information, or a combination of the forgoing such as compositional and topographical information. The scanning probe microscope may also employ a combination of detection mechanisms. For example, the microscope may operate in both a contacting mode where displacement of the tip is caused by topographical features, and in a non-contacting mode where displacement of the tip is caused by electrostatic charges in the substrate induced by a conductive microscope tip. The detection limit of the microscope may be in the range from about 0.1 nm to about 100 µm. In one aspect of the invention, the microscope has a detection limit in the range from about 1 nm to about 1 µm. In a further aspect of the invention, the scanning probe microscope has a detection limit in the range from about 10 nm to about 0.1 µm.

The scanning probe microscope scans the substrate surface in search of defects. The SPM may scan the entire surface or only selected portions thereof. For example, the SPM may only scan portions of the surface identified by a preliminary scan identifying potential defect location. The preliminary scan may be carried out with a different scan technique, such as another SPM technique or with optical microscopy. In one aspect of the invention, when a defect is found or suspected, the region where the defect is thought to be is scanned by the SPM to precisely locate the defect. In another aspect of the invention, defects are detected using a combination of topographical and compositional information obtained using an SPM.

Some types of defects may be recognized as soon as they are encountered by the SPM. Others may not be recognized until a region around the defect has been mapped. Accordingly, the repair operation may be initiated as soon as a defect is encountered or it may be postponed until a region of the surface has been mapped. Defects are repaired at locations determined by the SPM. In one aspect of the invention, the SPM is positioned over the defect, or adjacent to it, and the SPM is used to repair the defect. In another aspect of the invention, the SPM is positioned over or near the defect and the defect is repaired by a separate tool that has a location fixed relative to the current position of the SPM. In a further aspect of the invention, the defect location determined by the SPM is communicated to a separate defect repair system that repairs the defect at the location determined by the SPM.

The repair tool can be the same tip used to detect the defect. This is not only convenient, but ensures accuracy of the repair. On the other hand, very accurate repairs can be carried out using a separate structure, particularly one with fixed position relative to the scanning tip. Using a separate structure to repair the defect allows greater design flexibility in that the repair structure does not have to also be adapted for scanning. The repair structure can be, for example, a tip for scribing the surface, a tip for applying an electric field to the surface, or a tip for heating the surface.

Figure 2:
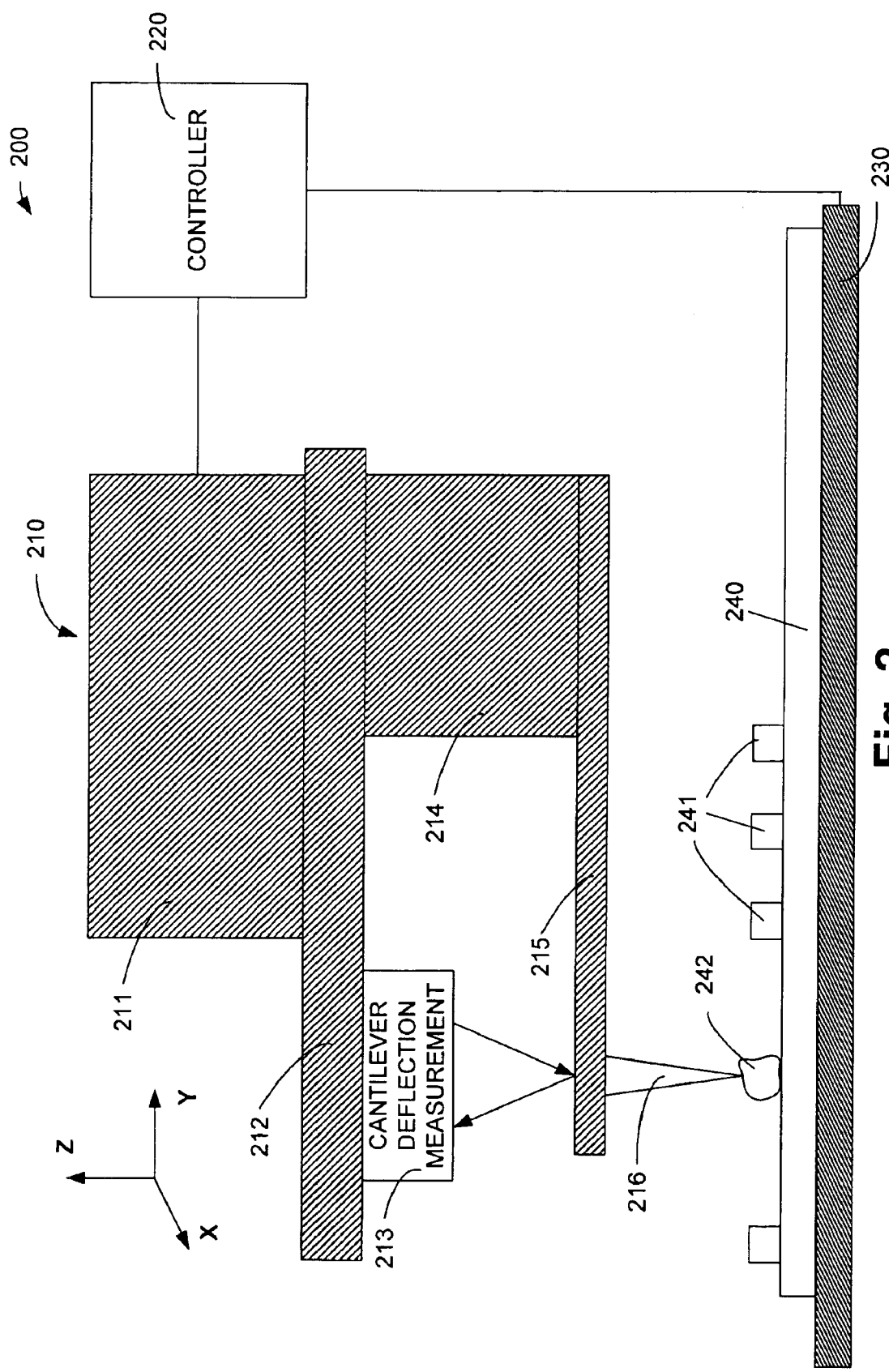
FIG. 2 is a schematic illustration of a system for locating and repairing defects in a workpiece according to one aspect of the present invention.

FIG. 2 schematically illustrates a scanning probe microscope system according to one aspect of the invention where the same scanning probe microscope tip is used to detect and repair defects. System 200 includes atomic force microscope (AFM) 210, controller 220, and positioning table 230. Controller 220 operates AFM 210 and positioning table 230 to scan across substrate 240 in the X and Y directions. Positioning table 230 may also provide for moving substrate 240 in the Z direction. AFM 210 includes body 211, scanning head 212, deflection measuring system 213, base 214, cantilever 215, and tip 216. Body 211 may provide for positioning scanning head 212 and the lower portions of AFM 210 in the Z direction. Deflection system 213 measures the deflection of cantilever 215 caused by the interaction of tip 216 with the surface of substrate 240, including features 241 and defect 242. Body 211 regulates the torque on cantilever 215 and the consequent normal force of tip 216 against the surface of substrate 240.

The following is an example of how system 200 may operate to detect defects in the substrate surface topography and/or composition: Controller 220, which contains a microprocessor and memory programmed with software instructions, maps substrate 240, or a portion thereof, into a grid wherein each portion of the grid corresponds to an XY position. Controller 240 directs position table 230 to move substrate 240 in a predetermined manner such that tip 216 scans across the surface of substrate 240. At the location ($X_i$, $Y_j$), AFM 210 detects a characteristic associated with the surface and converts the characteristic into one or more electrical signals, for example, analog signals or digital signals which represent the detected characteristic(s), and transmits the detected data to controller 240. Controller 240 analyzes the detected data according to its programming to determine a characteristic of the substrate surface at that location. Using such information from multiple locations on substrate 240, controller 220 generates, for example, a map of the surface of substrate 240 including the location of any defects.

When defects are located, system 200 uses the surface map and additional readings from microscope 210 to reposition tip 216 over or adjacent the defect. The additional readings may be compared to the surface map to determine the location of tip 216 relative to the defect. Tip 216 is then used to repair the defect. In one example, AFM 210 increases the normal force on tip 216 to the extent that when substrate 240 is moved in the X and/or Y direction, tip 216 scribes the surface of substrate 240. The normal force used for locating defects is, for example, from about 0.1 nN to about 20 nN. In one aspect of the invention, the normal force used for removing defects is at least about 10 times greater than the force used for locating defects. In another aspect of the invention, the normal force used for removing defects is at least about 100 times greater than the force used for locating defects. The force used depends on the material being scribed and may also be varied based on the amount of material that needs to be removed. In one example, the normal force used to scribe the surface is in the range from about 20 nN to about 2 $\mu$N. In another example, the normal force used is from about 100 nN to about 500 nN. Controller 220 causes tip 216 to scribe across the location of the defect as many times as necessary to remove the defect. Data from tip 216 may be used to determined when defect removal is complete. During the scribing operation, controller 220 may vary the normal force on tip 216 to vary the depth to which the surface is scribed at different locations. In this example, tip 216 includes a hard material suitable for scribing the substrate surface. For example, tip 216 may be provided with a diamond tip.

In another aspect of the invention, defects are repaired by switching on an electric field between substrate 240 and tip 216. The electric field is applied by biasing substrate 240 to a first voltage and tip 216 to a second voltage. As an example, the voltage difference may be in the range from about 1 V to about 100 V. By way of further example, the current may be in the range from about 0.1 nA to about 10 nA. In this aspect of the invention, tip 216 is conductive, has a conductive coating, or includes a conductive strip. For example, tip 216 may have a strip of gold to which a voltage can be applied. The electric field causes oxidation of the defect. The material removed from the substrate may be of a type that volatilizes upon oxidation. Alternatively, the material removed may be material that becomes more soluble in a solvent developer after oxidation and a developing step may be used to remove the oxidized material from the surface.

In a further aspect of the invention, defects are repaired by heating tip 216. Tip 216 may be heated by running a current through tip 216. For example, tip 116 may include or comprise a metal wire through which a current may be run. Suitable metals may include platinum, silver, copper, and alloys of the forgoing such as a platinum/rhodium alloy. Another option is to heat tip 216 with a laser focused on tip 216. A pulsed laser provides controlled doses of energy, although a continuous laser may also be used. To facilitate laser heating, tip 216 may be provided with an absorbtive material such as a strip of gold. Heat from tip 216 may physically remove the defect or induce a chemical reaction that results in defect removed. Physical remove may include melting and/or vaporization. Chemical removal may include burning with oxygen. A suitable atmosphere around the scanning tip may be provided to facilitate removal by a chemical reaction, such as burning.

Figure 3:
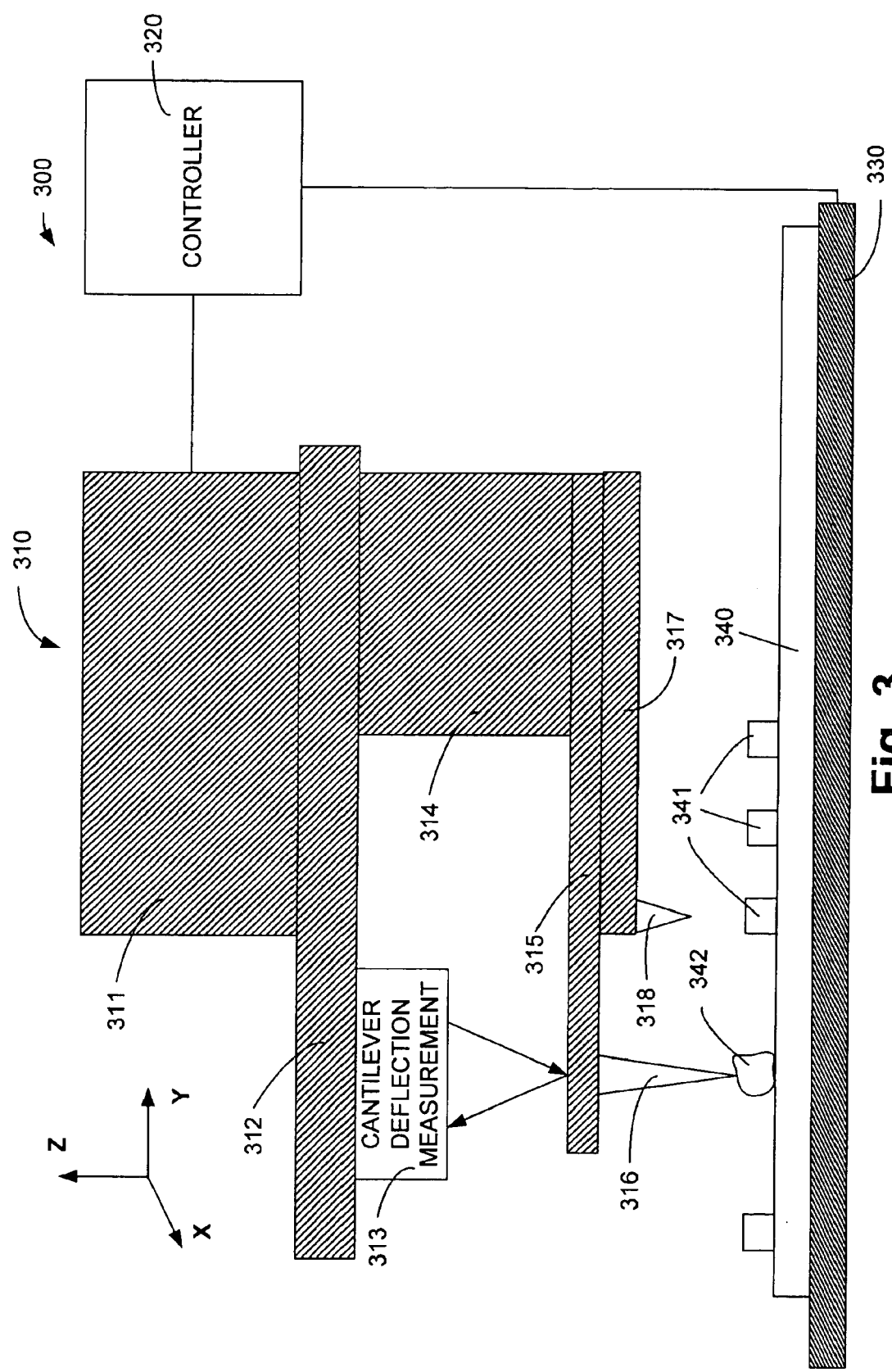
FIG. 3 is a schematic of a system for locating and repairing defects in a workpiece according to another aspect of the invention, illustrated in scan mode.

FIG. 3 schematically illustrates a scanning probe microscope system that can be used to carry out the invention in one of its aspects wherein the scanning probe microscope has two tips, one for detection and the other for defect repair. System 300 includes atomic force microscope (AFM) 310, controller 320, and positioning table 330. AFM 310 includes body 311, scanning head 312, deflection measuring system 313, base 314, measuring cantilever 315, measuring tip 316, scribing cantilever 317, and scribing tip 318. Deflection system 313 measures the deflection of measuring cantilever 315 caused by the interaction of measuring tip 316 with the surface of substrate 340, including features 341 and defect 342. Body 330 regulates the height of base 370 in the Z direction.

System 300 maps the surface of substrate 340, for example in the same way that system 200 maps the surface of substrate 240. In the absence of torque, and under the low torques exerted by body 311 while the surface is being mapped, scribing tip 318 is further from the surface than measuring tip 316 and scribing tip 318 does not interact significantly with the surface.

When defects are located, system 300 uses the defect map and data from microscope measuring tip 316 to position scribing tip 318 over the defect. After moving measuring tip 316 to the approximate location of the defect, measuring tip 316 begins gathering data regarding the surface, and controller 320 correlates that data to previously gathered data to determine the location of the measuring tip relative to the defect. Once the location of the tip relative to the defect is determined, the measuring tip is guided to a position on or adjacent the defect such that the scribing tip is directly over or adjacent the defect. System 310 then closes the distance between the surface of substrate 340 and AFM 310.

Figure 4:
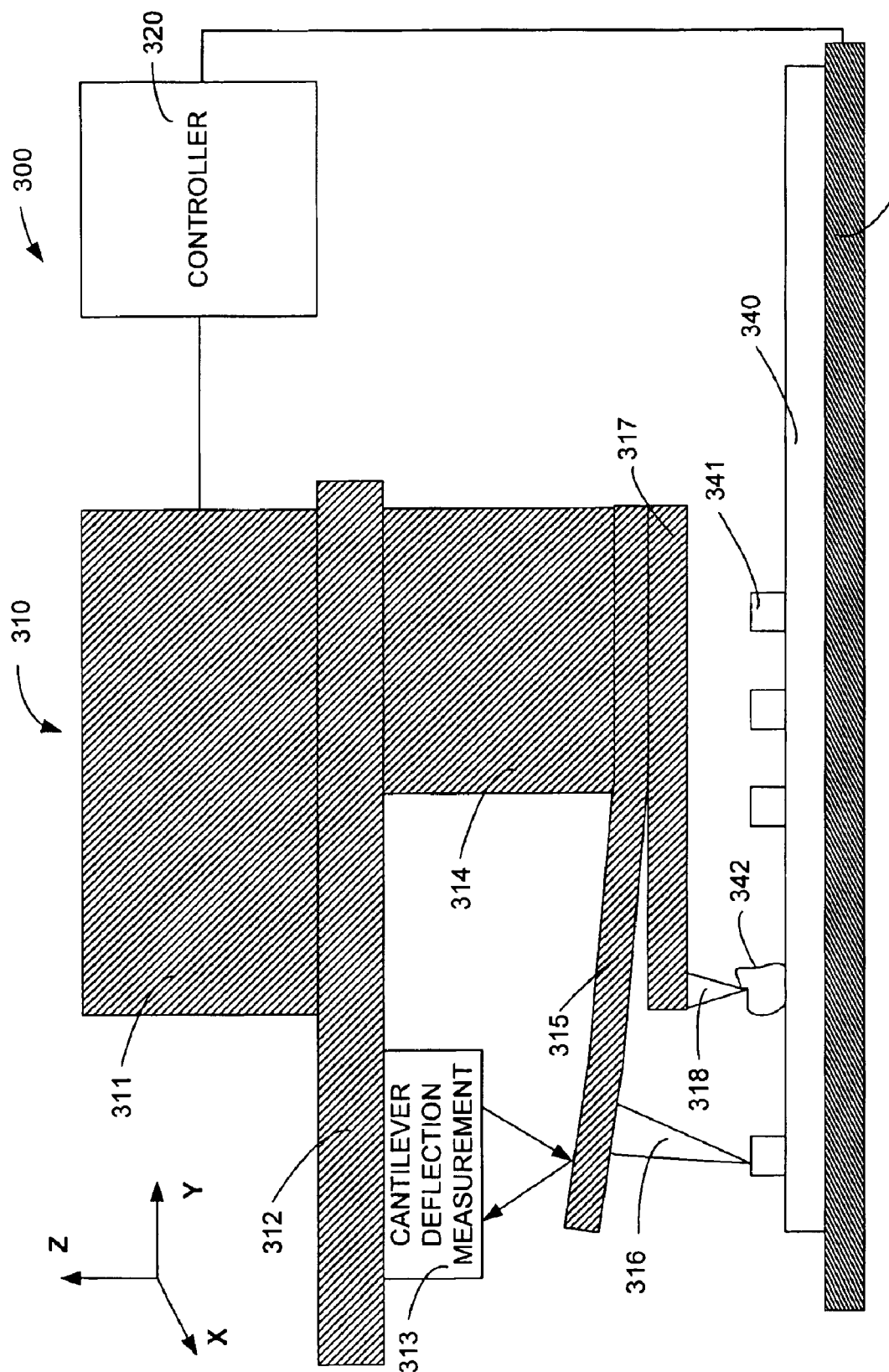
FIG. 4 is another schematic of the system of FIG. 3, illustrated in defect repair mode.

As illustrated by FIG. 4, closing the distance between AFM 310 and substrate 340 causes the normal force on measuring cantilever 315 to increase. Measuring cantilever 315 deflects away from the surface with the result that the relative difference in height above the surface of substrate 340 between measuring tip 316 and scribing tip 318 decreases. Cantilever 317 is much more rigid than cantilever 315 such that once cantilever 315 has deflected to a sufficient degree, increases in the normal force exerted by microscope 310 against the surface of substrate 340 are exerted primarily through scribing tip 318. Tip 318 includes a hard material suitable for scribing the substrate surface. For example, tip 318 may include a diamond. Controller 340 causes scribing tip 318 to scribe across the location of the defect as many times as necessary to remove the defect. During this operation, data from measuring tip 316 may be used to determine when defect removal is complete.

Repair operations of the invention, particularly those involving mechanical scribing of a substrate, may be facilitated by blowing a stream of ionized air against the substrate in the area of the defect. The ionized air may neutralize charges and facilitate release of particulate debris from the surface and the flow of air may serve to convect the debris away from the surface. A vacuum system may also be provided to capture the blown debris and prevent it from contaminating the substrate or the environment in which the substrate is being processed.

Figure 5:
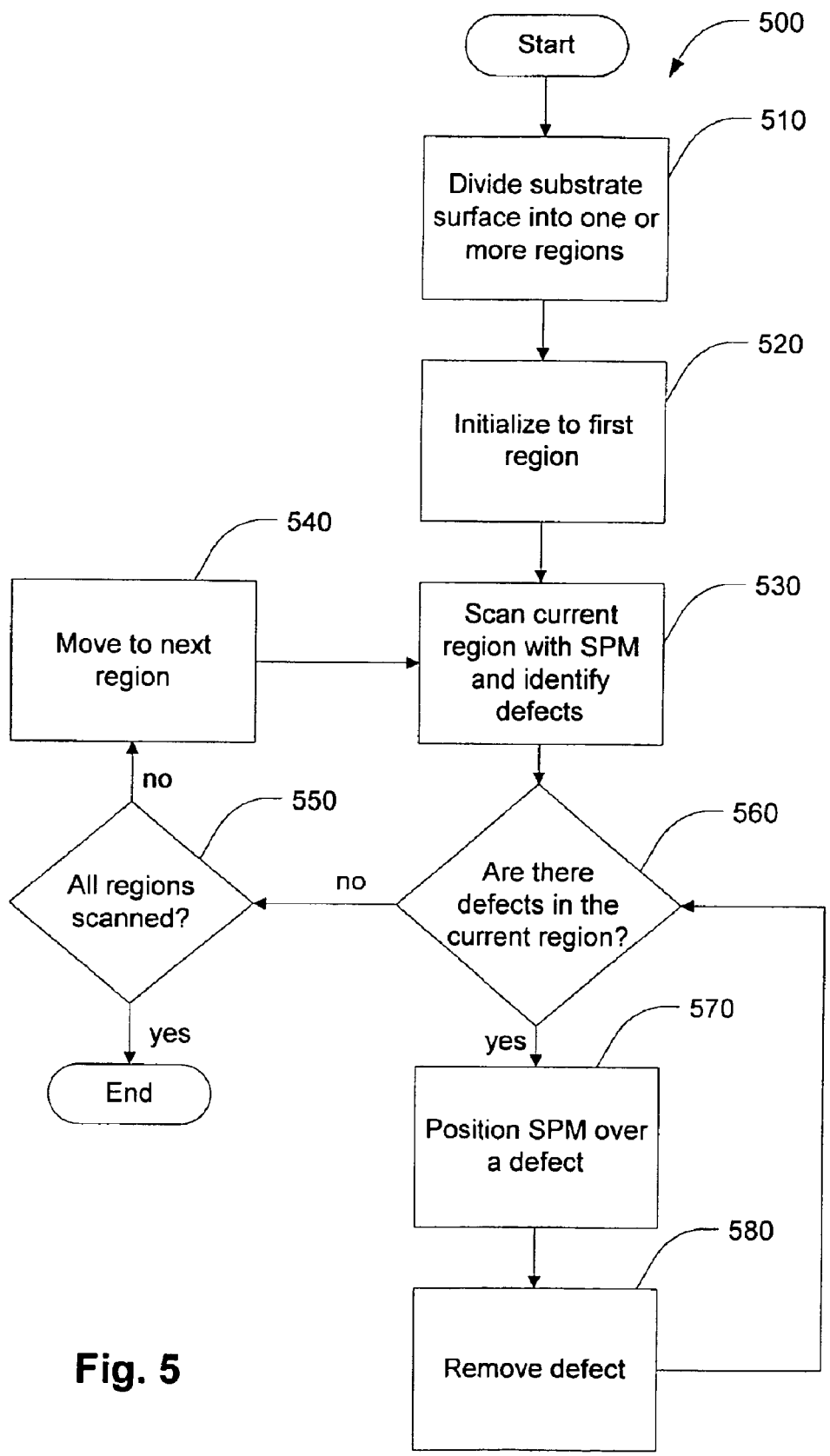
FIG. 5 is a flow diagram of a process according to one aspect of the present invention.

FIG. 5 is a flow diagram of a process 500 for repairing defects in a processed semiconductor substrate according to one aspect of the invention. In step 510, the substrate surface is divided into regions. In step 530, a region is scanned using an SPM and defects within the region are identified. If there are defects in the region, the SPM is positioned over or adjacent the defect in step 570. With the SPM positioned over or adjacent the defect, the defect is then removed in step 580. By combining the repair operation with the scanning probe microscope's sensitive defect location system, very precise repairs can be carried out.

What has been described above is the present invention and several of its specific embodiments. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for repairing defects in a semiconductor substrate, comprising:
    a scanning probe microscope that has a measuring tip and a scribing tip; and
    a defect repair system that repairs defects in a substrate via application of a first voltage to the substrate and a second voltage to the scribing tip, which is positioned at a location determined by the scanning probe microscope;
    wherein defect location(s) and the substrate itself are mapped into a grid, each portion of which corresponds to an XY position.

2. The system of claim 1, wherein the defects are mechanically removed from the substrate using the scribing tip.

3. The system of claim 2, wherein the scanning probe microscope is an atomic force microscope.

4. The method of claim 3, wherein the scribing tip of the scanning probe microscope has a diamond tip.

5. The system of claim 1, wherein the voltage difference causes defects to be oxidized away.

6. The system of claim 1, wherein the defects are repaired by heating the scribing tip.

7. The system of claim 1, wherein the system locates defects by obtaining both topographical and compositional information concerning the substrate.

8. The system of claim 7, wherein the system creates an electrostatic charge in a portion of the substrate.

9. The system of claim 1, wherein the measuring tip has fixed position relative to the scribing tip of the scanning probe microscope.

10. The system of claim 1, wherein the defect repair system receives a defect map generated using the scanning probe microscope.

11. A system for repairing defects in a semiconductor substrate, comprising:
    a scanning probe microscope that has a measuring tip and a scribing tip;
    means for selectively processing the semiconductor substrate to repair defects at locations on the semiconductor substrate determined by the scanning probe microscope;
    means for applying a first biasing voltage to the semiconductor substrate and a second biasing voltage to the scribing tip; and
    means for mapping the semiconductor substrate and defect locations thereon in a grid pattern.

12. A method of repairing a defect in a semiconductor substrate comprising:
    locating the defect via employing a measuring tip of a scanning probe microscope;
    mapping the defect location to XY coordinates in a grid map of the semiconductor substrate; and
    repairing the defect at the location determined by the scanning probe microscope measuring tip via employing a scribing tip, wherein a first biasing voltage is applied to the semiconductor substrate and a second biasing voltage is applied to the scribing tip.

13. The method of claim 12, wherein the defect is mechanically removed from the substrate using the scribing tip.

14. The method of claim 13, wherein the scanning probe microscope is an atomic force microscope.

15. The method of claim 14, wherein the scribing tip of the scanning probe microscope has a diamond tip.

16. The method of claim 13, wherein the defect is removed by forcing the tip against the substrate with a normal force that is at least about ten times greater than the normal force applied to detect the defect.

17. The method of claim 12, wherein the voltage difference causes the defect to be oxidized away.

18. The method of claim 12, wherein the step of repairing the defect comprises heating the scribing tip.

19. The method of claim 12, is further comprising the step of determining the approximate location of the defect with another instrument prior to the step of determining the defect's location using the scanning probe microscope.

20. The method of claim 12, wherein the step of locating the defect comprises obtains both topographical and compositional information regarding the substrate.

21. The method of claim 20, wherein the step of locating the defect comprising creating an electrostatic charge in a portion of the substrate.

* * * * *